United States Patent
Brada et al.

(10) Patent No.: US 11,519,992 B2
(45) Date of Patent: Dec. 6, 2022

(54) SYSTEMS AND METHODS OF AUTOMATICALLY DETECTING AND SCORING MOTION ARTIFACTS IN MAGNETIC RESONANCE IMAGING

(71) Applicant: GE PRECISION HEALTHCARE LLC, Wauwatosa, WI (US)

(72) Inventors: Rafael Shmuel Brada, Hod-Hasharon (IL); Christopher Judson Hardy, Schenectady, NY (US); Sangtae Ahn, Guilderland, NY (US)

(73) Assignee: GE PRECISION HEALTHCARE LLC, Wauwatosa, WI (US)

(*) Notice: Subject to any disclaimer, the term of this patent is extended or adjusted under 35 U.S.C. 154(b) by 331 days.

(21) Appl. No.: 17/003,281

(22) Filed: Aug. 26, 2020

(65) Prior Publication Data

US 2022/0065969 A1 Mar. 3, 2022

(51) Int. Cl.
*G01R 33/565* (2006.01)
*G01R 33/56* (2006.01)
(Continued)

(52) U.S. Cl.
CPC ... *G01R 33/56509* (2013.01); *G01R 33/4835* (2013.01); *G01R 33/5608* (2013.01);
(Continued)

(58) Field of Classification Search
CPC .......... G01R 33/56509; G01R 33/4835; G01R 33/5608; G01R 33/5617; G06T 7/0012; G06T 7/20; G06T 11/008; G06T 2207/10088; G06T 2207/20224; G06T 2207/30168; G06T 7/0002; A61B 5/055
See application file for complete search history.

(56) References Cited

U.S. PATENT DOCUMENTS 6,329,819 B1   12/2001   Manduca et al.
7,860,291 B2   12/2010   Hwang
(Continued)

OTHER PUBLICATIONS

Bruno Madore and R. Mark Henkelman: "A New Way of Averaging with Applications to MRI"; published Oct. 5, 1995; American Association of Physicists in Medicine; pp. 109-113. (Year: 1995).*
Atkinson et al., "Automatic correction of motion artifacts in magnetic resonance images using an entropy focus criterion", IEEE Transactions on Medical Imaging, pp. 903-910, vol. 16, Issue: 6, Dec. 1997.
(Continued)

*Primary Examiner* — Siamak Harandi
(74) *Attorney, Agent, or Firm* — Armstrong Teasdale LLP

(57) ABSTRACT

A magnetic resonance (MR) imaging method of detecting and scoring motion artifacts in MR images of an object is provided. The method includes computing a k-space difference map based at least in part on first MR signals of the object acquired with a first coil and second MR signals of the object acquired with a second coil. The method also includes generating a difference plot based on the k-space difference map, the difference plot including a curve. The method further includes calculating a motion score based on the curve in the difference plot, wherein the motion score indicates the level of motion artifacts in the image caused by motion of the object during acquisition of the first MR signals and the second MR signals, and the motion score includes an area under the curve. Moreover, the method includes outputting the motion score.

20 Claims, 12 Drawing Sheets

(51) Int. Cl.
  *G01R 33/483* (2006.01)
  *G06T 7/20* (2017.01)
  *G06T 11/00* (2006.01)
  *G06T 7/00* (2017.01)

(52) U.S. Cl.
  CPC .............. *G06T 7/0012* (2013.01); *G06T 7/20* (2013.01); *G06T 11/008* (2013.01); *G06T 2207/10088* (2013.01); *G06T 2207/20224* (2013.01); *G06T 2207/30168* (2013.01)

(56) References Cited

U.S. PATENT DOCUMENTS

| | | | |
|---|---|---|---|
| 8,306,299 | B2 | 11/2012 | Samsonov et al. |
| 9,714,998 | B2 | 7/2017 | Krueger et al. |
| 10,806,370 | B1* | 10/2020 | Brada ............... A61B 5/7207 |
| 2008/0205730 | A1 | 8/2008 | Stehning et al. |
| 2012/0257806 | A1* | 10/2012 | Sheltraw ............... A61B 5/055 382/131 |
| 2017/0219674 | A1 | 8/2017 | Van Der Kouwe et al. |
| 2018/0210058 | A1 | 7/2018 | De Weerdt |

OTHER PUBLICATIONS

James G. Pipe, "Motion correction with PROPELLER MRI: Application to head motion and free-breathing cardiac imaging", Magnetic Resonance in Medicine, pp. 963-969, vol. 42, Issue: 5, Nov. 1999.

K Pawar et al. "Motion correction in MRI using deep convolutional neural network", ISMRM, Paris, 2018.

K Sommer et al., "Correction of motion artifacts using a multi-resolution fully convolutional neural network", ISMRM, Paris, 2018.

S Braun et al., "Wasserstein GAN for motion artifact reduction of MR images", ISMRM, Paris, 2018.

P Johnson et al., "Motion correction in MRI using deep learning", ISMRM, Paris, 2018.

T Kustner et al., "Automated reference-free detection of motion artifacts in magnetic resonance images", Magn Reson Mater Phy, pp. 243-256, vol. 31, Sep. 2017.

B Lorch et al., "Automated Detection of Motion Artifacts in MR Imaging Using Decision Forests", Journal of Medical Engineering, 9 pages, vol. 2017, Jun. 2017.

* cited by examiner

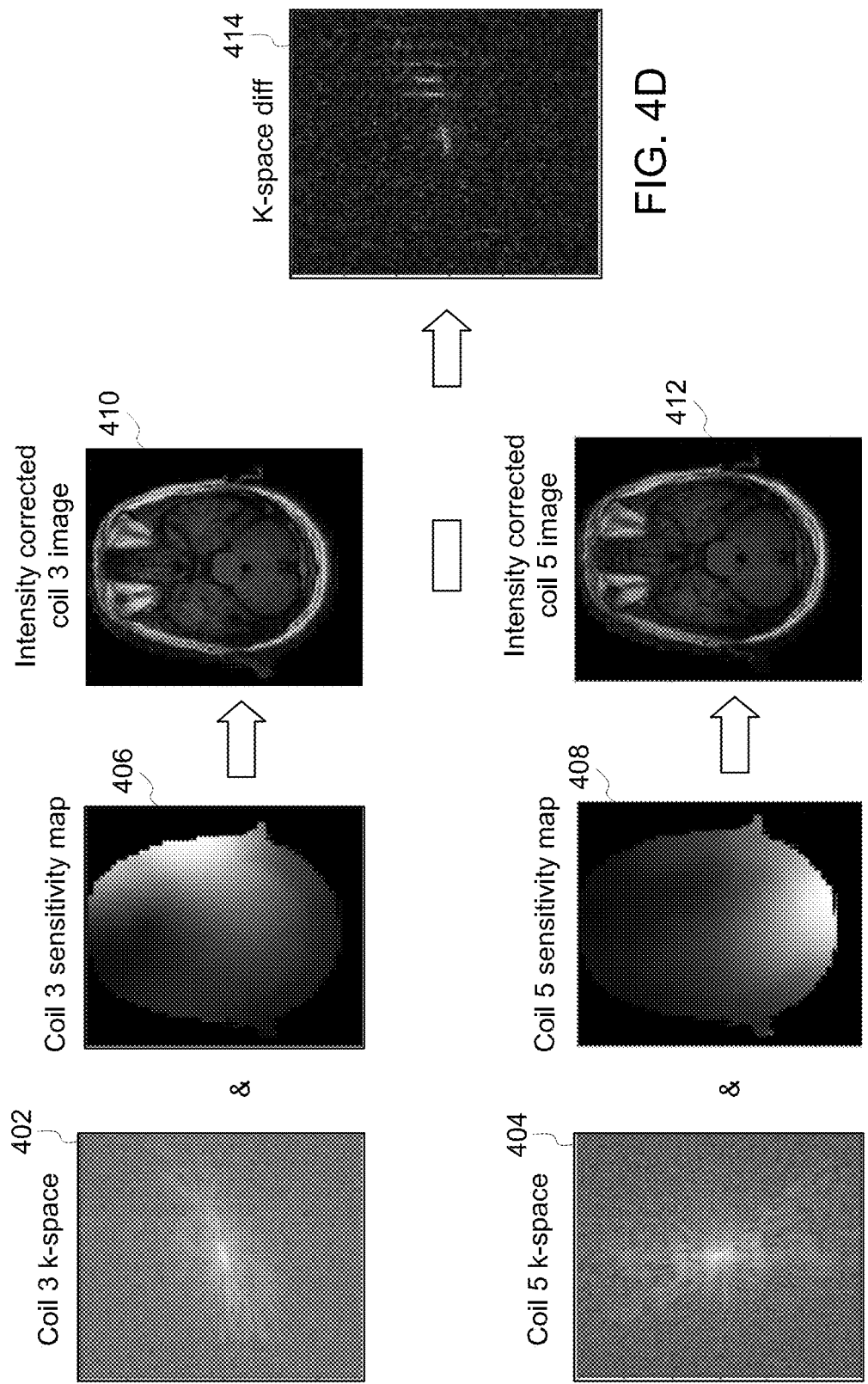

Discrete motion score = 1.3

Discrete motion score = 0

SYSTEMS AND METHODS OF AUTOMATICALLY DETECTING AND SCORING MOTION ARTIFACTS IN MAGNETIC RESONANCE IMAGING

BACKGROUND

The field of the disclosure relates generally to systems and methods of detecting and scoring motion artifacts, and more particularly, to systems and methods of automatically detecting and scoring motion artifacts in magnetic resonance (MR) images.

Magnetic resonance imaging (MRI) has proven useful in diagnosis of many diseases. MRI provides detailed images of soft tissues, abnormal tissues such as tumors, and other structures, which cannot be readily imaged by other imaging modalities, such as computed tomography (CT). Further, MRI operates without exposing patients to ionizing radiation experienced in modalities such as CT and x-rays.

Patient motion is one of the biggest sources of inefficiency in clinical MRI, often requiring re-scans or even second visits by the patient. In particular, patient motion can cause blurriness, artifacts, and other inconsistencies in MR images. Known approaches to detect motion require either additional hardware for monitoring the motion, which adds to cost and patient setup time, or navigator sequences, which take time away from the imaging sequence.

BRIEF DESCRIPTION

In one aspect, a magnetic resonance (MR) imaging method of detecting and scoring motion artifacts in MR images of an object is provided. The method includes computing a k-space difference map based at least in part on first MR signals of the object acquired with a first coil and second MR signals of the object acquired simultaneously with a second coil. The method also includes generating a difference plot based on the k-space difference map, the difference plot including a curve. The method further includes calculating a motion score based on the curve in the difference plot, wherein the motion score indicates the level of motion artifacts in the image caused by motion of the object during acquisition of the first MR signals and the second MR signals, and the motion score includes an area under the curve. Moreover, the method includes outputting the motion score.

In another aspect, a motion detection and scoring computing device, including at least one processor in communication with at least one memory device, is provided. The at least one processor is programmed to compute a k-space difference map based at least in part on first MR signals of the object acquired with a first coil and second MR signals of the object simultaneously acquired with a second coil. The at least one processor is also programmed to generate a difference plot based on the k-space difference map, the difference plot including a curve. The at least one processor is further programmed to calculate a motion score based on the curve in the difference plot, wherein the motion score indicates the level of motion artifacts in the image caused by motion of the object during acquisition of the first MR signals and the second MR signals, and the motion score includes an area under the curve. Moreover, the at least one processor is programmed to output the motion score.

DRAWINGS

FIG. 4A are complex k-space data from two different coils in a receiver array, where the magnitudes of the complex k-space data are displayed.

FIG. 4B are complex coil sensitivity maps of the coils used to acquire the k-space data shown in FIG. 4A, where the magnitudes of the complex coil sensitivity maps are displayed.

FIG. 4C are complex intensity-corrected images based on the k-space data shown in FIG. 4A and the coil sensitivity maps shown in FIG. 4B, where the magnitudes of the complex intensity-corrected images are displayed.

FIG. 4D is a k-space difference map generated by subtracting the complex intensity-corrected images shown in FIG. 4C, Fourier transforming the result, and then taking the magnitude.

DETAILED DESCRIPTION

The disclosure includes systems and methods of detecting and scoring motion artifacts in magnetic resonance (MR) images of an object using MR signals from different coils. An object used herein is an object that is placed inside the bore of an MR imaging (MRI) system and being imaged by the MRI system. The object may be a human subject, an animal, or a phantom. The systems and methods disclosed herein provide an objective indicator of motion artifacts, without the need of input from a user. Neither additional hardware nor navigator pulses are needed. Further, compared to artificial intelligence approaches of scoring motion, the systems and methods disclosed herein need minimal training image datasets and limited human involvement in rating the motions. Method aspects will be in part apparent and in part explicitly discussed in the following description.

In magnetic resonance imaging (MRI), an object is placed in a magnet. When the object is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as B0 and extends in the longitudinal or z direction. In acquiring an MRI image, a magnetic field (referred to as an excitation field B1), which is in the x-y plane and near the Larmor frequency, is generated by a radio-frequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal B1 is terminated. To use the MR signals to generate an image of an object, magnetic field gradient pulses (Gx, Gy, and Gz) are used. The gradient pulses are used to scan through the k space, the space of spatial frequencies or inverse of distances. A Fourier relationship exists between the acquired MR signals and an image of the object, and therefore the image of the object can be derived by reconstructing the MR signals.

Figure 1:
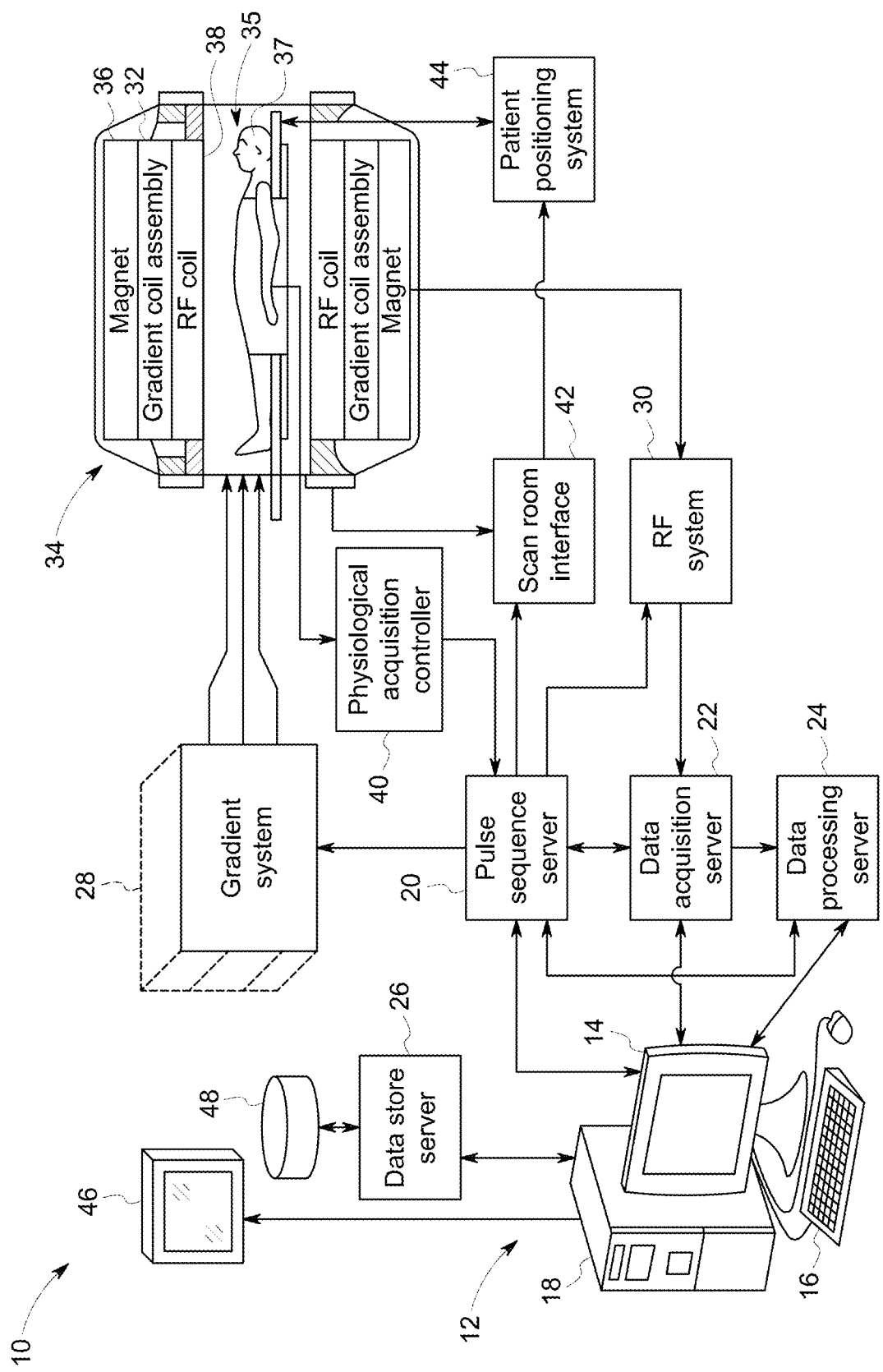
FIG. 1 is a schematic diagram of an exemplary magnetic resonance imaging (MRI) system.

FIG. 1 illustrates a schematic diagram of an exemplary MRI system 10. In the exemplary embodiment, the MRI system 10 includes a workstation 12 having a display 14 and a keyboard 16. The workstation 12 includes a processor 18, such as a commercially available programmable machine running a commercially available operating system. The workstation 12 provides an operator interface that allows scan prescriptions to be entered into the MRI system 10. The workstation 12 is coupled to a pulse sequence server 20, a data acquisition server 22, a data processing server 24, and a data store server 26. The workstation 12 and each server 20, 22, 24, and 26 communicate with each other.

In the exemplary embodiment, the pulse sequence server 20 responds to instructions downloaded from the workstation 12 to operate a gradient system 28 and a radiofrequency ("RF") system 30. The instructions are used to produce gradient and RF waveforms in MR pulse sequences. An RF coil 38 and a gradient coil assembly 32 are used to perform the prescribed MR pulse sequence. The RF coil 38 is shown as a whole body RF coil. The RF coil 38 may also be a local coil that may be placed in proximity to the anatomy to be imaged, or a coil array that includes a plurality of coils.

In the exemplary embodiment, gradient waveforms used to perform the prescribed scan are produced and applied to the gradient system 28, which excites gradient coils in the gradient coil assembly 32 to produce the magnetic field gradients $G_x$, $G_y$, and $G_z$ used for position-encoding MR signals. The gradient coil assembly 32 forms part of a magnet assembly 34 that also includes a polarizing magnet 36 and the RF coil 38. The magnet assembly 34 forms a bore 35, where an object 37 such as a patient is received and scanned.

In the exemplary embodiment, the RF system 30 includes an RF transmitter for producing RF pulses used in MR pulse sequences. The RF transmitter is responsive to the scan prescription and direction from the pulse sequence server 20 to produce RF pulses of a desired frequency, phase, and pulse amplitude waveform. The generated RF pulses may be applied to the RF coil 38 by the RF system 30. Responsive MR signals detected by the RF coil 38 are received by the RF system 30, amplified, demodulated, filtered, and digitized under direction of commands produced by the pulse sequence server 20. The RF coil 38 is described as a transmitter and receiver coil such that the RF coil 38 transmits RF pulses and detects MR signals. In one embodiment, the MRI system 10 may include a transmitter RF coil that transmits RF pulses and a separate receiver coil that detects MR signals. A transmission channel of the RF system 30 may be connected to a RF transmission coil and a receiver channel may be connected to a separate RF receiver coil. Often, the transmission channel is connected to the whole body RF coil 38 and each receiver section is connected to a separate local RF coil.

In the exemplary embodiment, the RF system 30 also includes one or more RF receiver channels. Each RF receiver channel includes an RF amplifier that amplifies the MR signal received by the RF coil 38 to which the channel is connected, and a detector that detects and digitizes the I and Q quadrature components of the received MR signal. The magnitude of the received MR signal may then be determined as the square root of the sum of the squares of the I and Q components as in Eq. (1) below:

$$M = \sqrt{I^2 + Q^2} \quad (1);$$

and the phase of the received MR signal may also be determined as in Eq. (2) below:

$$\varphi = \tan^{-1}\left(\frac{Q}{I}\right). \quad (2)$$

In the exemplary embodiment, the digitized MR signal samples produced by the RF system 30 are received by the data acquisition server 22. The data acquisition server 22 may operate in response to instructions downloaded from the workstation 12 to receive real-time MR data and provide buffer storage such that no data is lost by data overrun. In some scans, the data acquisition server 22 does little more than pass the acquired MR data to the data processing server 24. In scans that need information derived from acquired MR data to control further performance of the scan, however, the data acquisition server 22 is programmed to produce the needed information and convey it to the pulse sequence server 20. For example, during prescans, MR data is acquired and used to calibrate the pulse sequence performed by the pulse sequence server 20. Also, navigator signals may be acquired during a scan and used to adjust the operating parameters of the RF system 30 or the gradient system 28, or to control the view order in which k space is sampled.

In the exemplary embodiment, the data processing server 24 receives MR data from the data acquisition server 22 and processes it in accordance with instructions downloaded from the workstation 12. Such processing may include, for example, Fourier transformation of raw k-space MR data to produce two or three-dimensional images, the application of filters to a reconstructed image, the performance of a back-projection image reconstruction of acquired MR data, the generation of functional MR images, and the calculation of motion or flow images.

In the exemplary embodiment, images reconstructed by the data processing server 24 are conveyed back to, and stored at, the workstation 12. In some embodiments, real-time images are stored in a database memory cache (not shown in FIG. 1), from which they may be output to operator display 14 or a display 46 that is located near the magnet assembly 34 for use by attending physicians. Batch mode images or selected real time images may be stored in a host database on disc storage 48 or on a cloud. When such images have been reconstructed and transferred to storage, the data processing server 24 notifies the data store server 26. The workstation 12 may be used by an operator to archive the images, produce films, or send the images via a network to other facilities.

During scanning, it is desirable to have the object remain still for the duration of the scan because motion of the object during the scan will produce motion artifacts 203 that will reduce the quality of the MR images of the object. At times, the motion artifacts are so severe that the acquired images are obscured by image artifacts and a meaningful medical interpretation and diagnosis cannot be rendered. As a result, the object has to be rescanned. At that time, the object may have already been dismissed. Not only does rescanning add time, cost, and inconvenience to the object, but also medical information and images may lack consistency and alignment between the original scan and the rescan because of the time lag between the original scan and the rescanning and different imaging settings associated with the two scanning events. Accordingly, a system and method that notifies the operator of motion and/or the level of motion is desirable. The operator may rescan the object if the level of motion is at a degree that warrants rescanning. The operator may also activate a motion correction program to correct the images.

Known methods of motion detection require additional dedicated hardware or additional navigator pulses or sequences to detect motion. Additional hardware increases the time for scan set-up and requires additional system design and software to incorporate the motion signals acquired by the additional hardware with the MR signals acquired by the MRI system 10. Additional navigator pulses or sequences have the same associated challenges, along with increased scan time. In contrast, the systems and methods disclosed herein do not require either additional hardware or navigator sequences to yield enhanced motion detection.

Figure 2A:
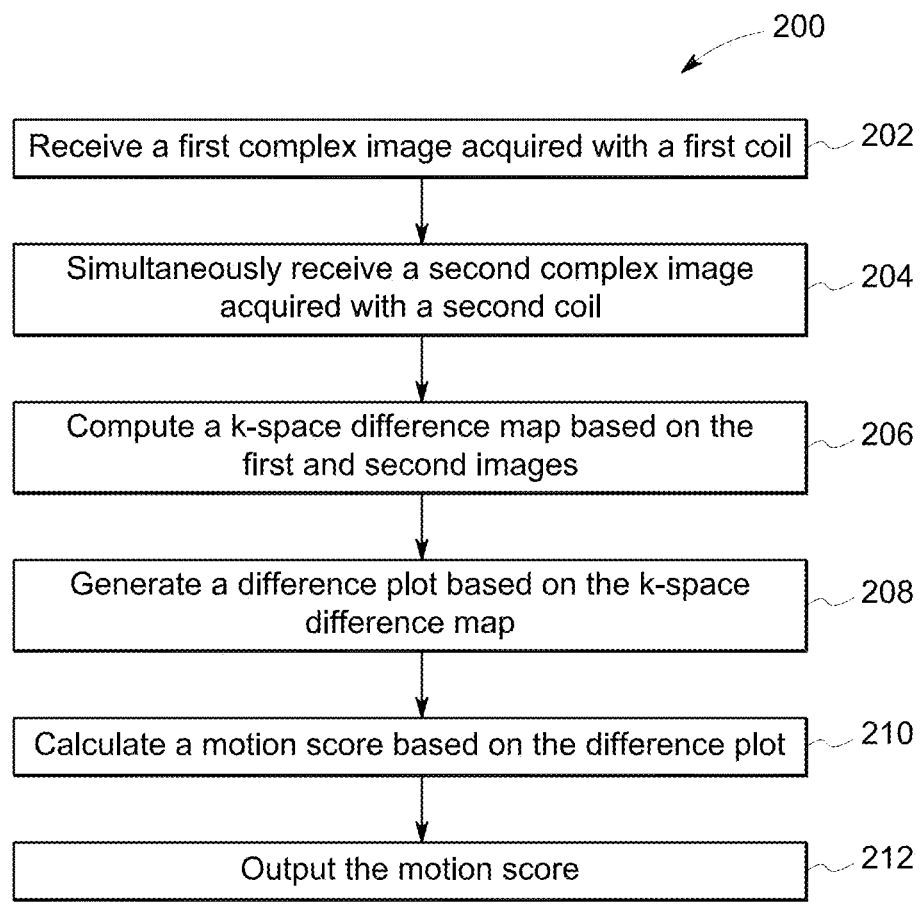
FIG. 2A is a flow chart of an exemplary method of detecting and scoring motion artifacts in magnetic resonance (MR) images.
Figure 2B:
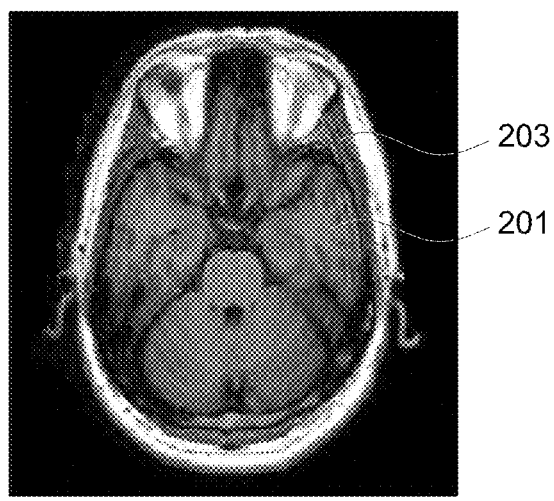
FIG. 2B is an MR image having motion artifacts.

FIG. 2A is a flow chart of an exemplary MRI method 200 of detecting and scoring motion artifacts in MR images of an object 37. FIG. 2B is an MR brain image 201 that contains motion image artifacts 203. The method 200 may be implemented on a motion detection and scoring computing device. The motion detection and scoring computing device, which may be the workstation 12, or may be a computing device that is separate from the workstation 12 and is in communication with the workstation 12 through wired or wireless communication.

In the exemplary embodiment, the RF coil 38 of the MRI system 10 includes a plurality of RF coils for acquiring MR signals emitted from the object. The method 200 includes receiving 202 a first complex image of the object reconstructed based on MR signals acquired with a first coil. The method 200 further includes receiving 204 a second complex image of the object reconstructed based on MR signals simultaneously acquired with a second coil. The first and second complex images may be represented with complex numbers, pairs of real and imaginary numbers, or phasors. The first and second images are acquired at the same time by the same pulse sequence. In MR, a pulse sequence is a sequence of RF pulses, gradient pulses, and data acquisition applied by the MRI system 10 in acquiring MR signals. The pulse sequence may be a fast spin echo sequence.

In the exemplary embodiment, a k-space difference map between the first and second complex images is computed 206 based on the first and second images. In one embodiment, the k-space difference map is generated by subtracting the first and second complex images one from the other, applying a two-dimensional (2D) Fourier transform of the difference, and then taking the magnitude of the Fourier transformed difference. The first and second images are acquired with a pulse sequence. The method 200 further includes generating 208 a difference plot based on the k-space difference map. The method 200 also includes calculating 210 a motion score based on a curve in the difference plot. The motion score indicates the level of motion of the object during the imaging. The motion score may be an area under the curve in the difference plot. Further, the method 200 includes outputting 212 the motion score. An alert may be generated if the motion score is above a predetermined level. The predetermined level may be set as a level above which the acquired images are not usable for the purpose of medical diagnosis and the object needs to be rescanned with the pulse sequence. The alert may be prompted on the display 14 of the MRI system 10. Once the alert has been received, the operator decides whether to rescan or partially rescan only the slices that have motion artifacts or only with the pulse sequence. The operator may also choose not to rescan and instead activate motion correction processes to correct the motion artifacts in the images.

Figure 3A:
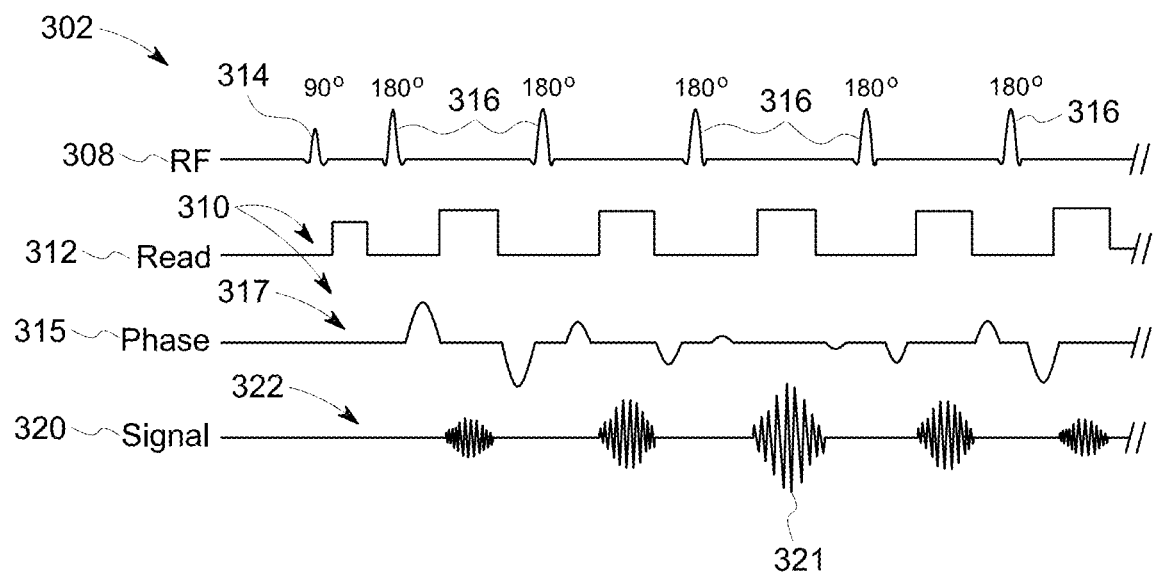
FIG. 3A is a pulse sequence diagram of an exemplary fast spin echo sequence.
Figure 3B:
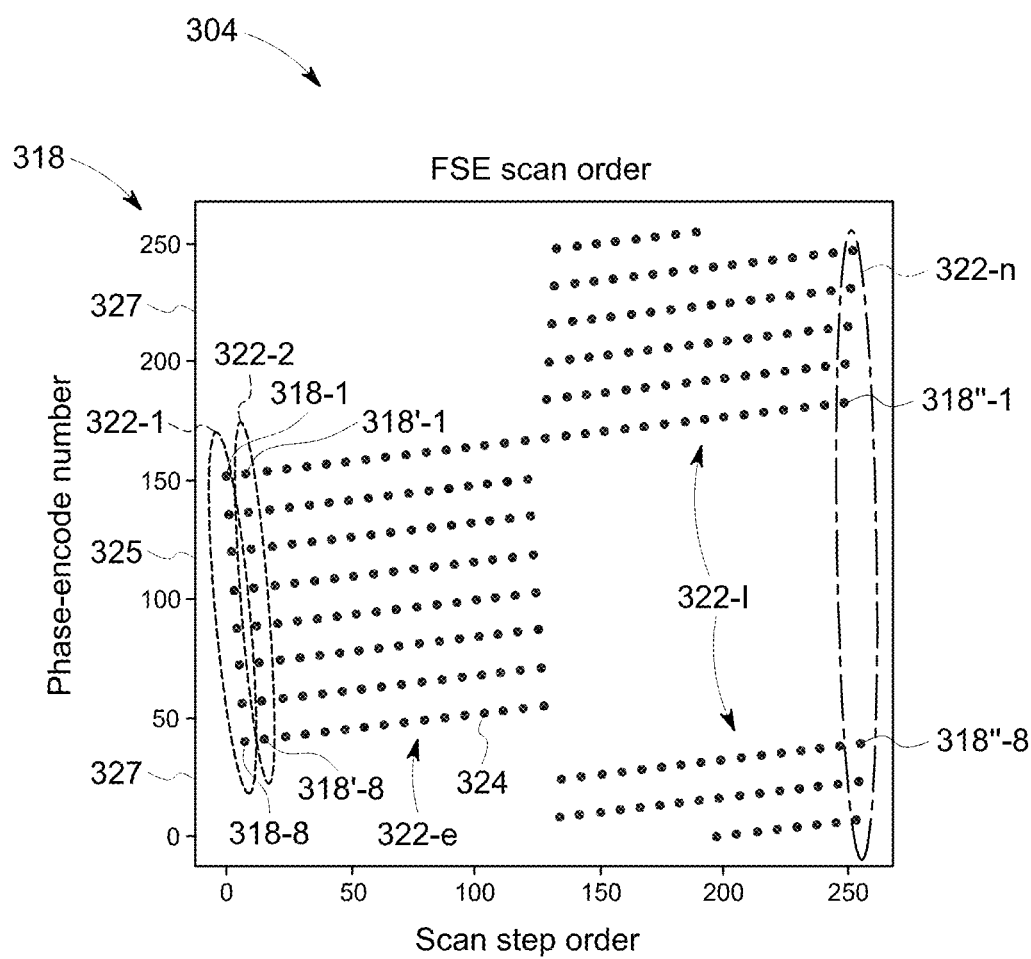
FIG. 3B is an exemplary scan order in applying the fast spin echo sequence shown in FIG. 3A.

FIGS. 3A-3B show a fast spin echo sequence 302 and a scan order 304 using the fast spin echo sequence 302 for acquiring an MR image. FIG. 3A is a pulse sequence diagram of the fast spin echo sequence 302. FIG. 3B is a diagram of an exemplary scan order 304.

The fast spin echo sequence 302 includes RF pulses 308 and gradient pulses 310. Gradient pulses 310 may be along the read-out direction 312 or phase-encoding direction 315. Gradient pulses 310 may be along a slice-encoding direction (not shown) or a second phase-encoding direction (not shown) in a three-dimensional (3D) pulse sequence. A diagram of the fast spin echo sequence 302 may also show MR signals in the signal channel 320. In the fast spin echo sequence 302, the RF pulses 308 include an excitation pulse 314 and a plurality of refocusing pulses 316. The excitation pulse 314 excites and rotates magnetization to the x-y plane. The refocusing pulses 316 refocus the magnetization that has dephased such that echoes 321 are formed. The signal channel 320 includes a series of echoes 321, or an echo train 322. The k-space locations of the echoes in the ky direction or phase-encoding direction are determined by the phase-encoding gradients 317. The time between the repetition of the pulse sequence 302 is referred to as a repetition time (TR). The number of echoes in one TR of the fast spin echo sequence 302 is referred to as an echo train length (ETL). The ETL may be any number between two and the image matrix size in the phase-encoding direction.

In operation, a slice in the object is selected and excited by the excitation pulse 314, and refocused by the refocusing pulses 316. The k space is scanned by varying gradient pulses 310. Echoes 321 of an ETL corresponding to a plurality of ky lines in the k space are acquired in one TR. The sequence 302 is repeated to scan through the k space to acquire MR signals at other ky lines. The MR signals are used to reconstruct MR images.

FIG. 3B is an exemplary scan order 304 in the ky direction. Each dot 324 represents an echo 321 or a ky line at a phase-encoding order, number, or index 318. In the example shown, the matrix size of the image in the y direction is 256. Matrix sizes may be in any other numbers. The ETL shown in FIG. 3B is 8. That is, in the first TR, an echo train 322-1 having 8 echoes 321 is acquired, where the 8 echoes 321 correspond to the ky lines at phase-encoding indexes 318-1 to 318-8. In the next TR, a next group of ky lines corresponding to phase encoding indexes 318'-1 to 318'-8 are acquired. The pulse sequence 302 is repeated until the last echo train 322-*n* of the slice or slice-encoding step (for 3D acquisition) is acquired, where the last echo train 322-*n* corresponds to phase encoding indexes 318"-1 to 318"-8. The scan order 304 is for one slice or one slice-encoding step. To acquire multiple slices of the object, the scan order 304 is repeated across slices or slice-encoding steps, and the ky values associated with a single echo train may be acquired across all slices before proceeding with the next echo train. The pulse sequence 302 may be applied with signals 320 simultaneously read from multiple coils of the RF coil 38. MR signals acquired by the coils are combined to reconstruct images of slices in the object.

Figure 4E:
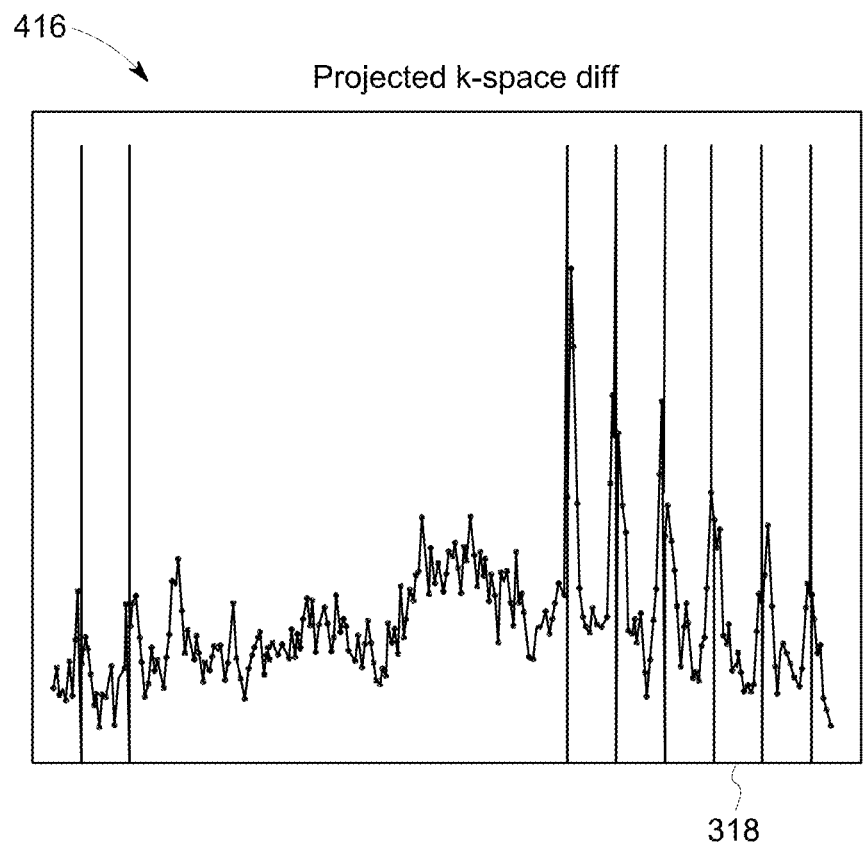
FIG. 4E is a projected difference plot based on the k-space difference map shown in FIG. 4D.

FIGS. 4A-4I depict the generation of a motion score, which indicates the level of motion of the object during the imaging. In the exemplary embodiment, first MR signals or first complex k-space data 402 acquired by a first coil, and second MR signals or second complex k-space data 404 acquired by a second coil, are provided (FIG. 4A). FIG. 4B shows a coil sensitivity map 406 of the first coil and a coil sensitivity map 408 of the second coil. Intensity-corrected complex images 410, 412 are derived by taking the inverse Fourier transform of the first or second k-space data 402, 404, multiplying with the complex conjugate of the corresponding coil sensitivity map 406, 408, and dividing the product by the squared magnitude of the corresponding coil sensitivity map 406, 408 (FIG. 4C). A k-space difference map 414 is generated by subtracting the intensity-corrected complex images 410, 412 with each other and then Fourier transforming the difference, or by Fourier transforming the intensity-corrected complex images 410, 412 and subtracting the Fourier-transformed images (FIG. 4D).

Figure 4F:
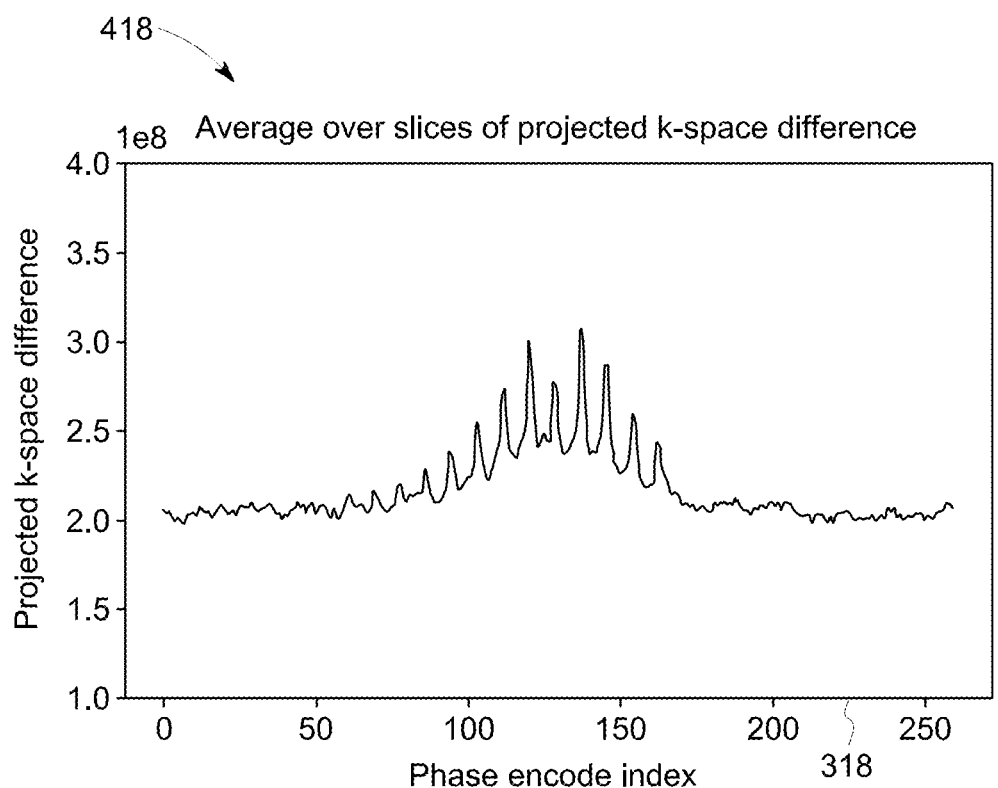
FIG. 4F is an averaged difference plot based on the difference plot shown in FIG. 4E.
Figure 4G:
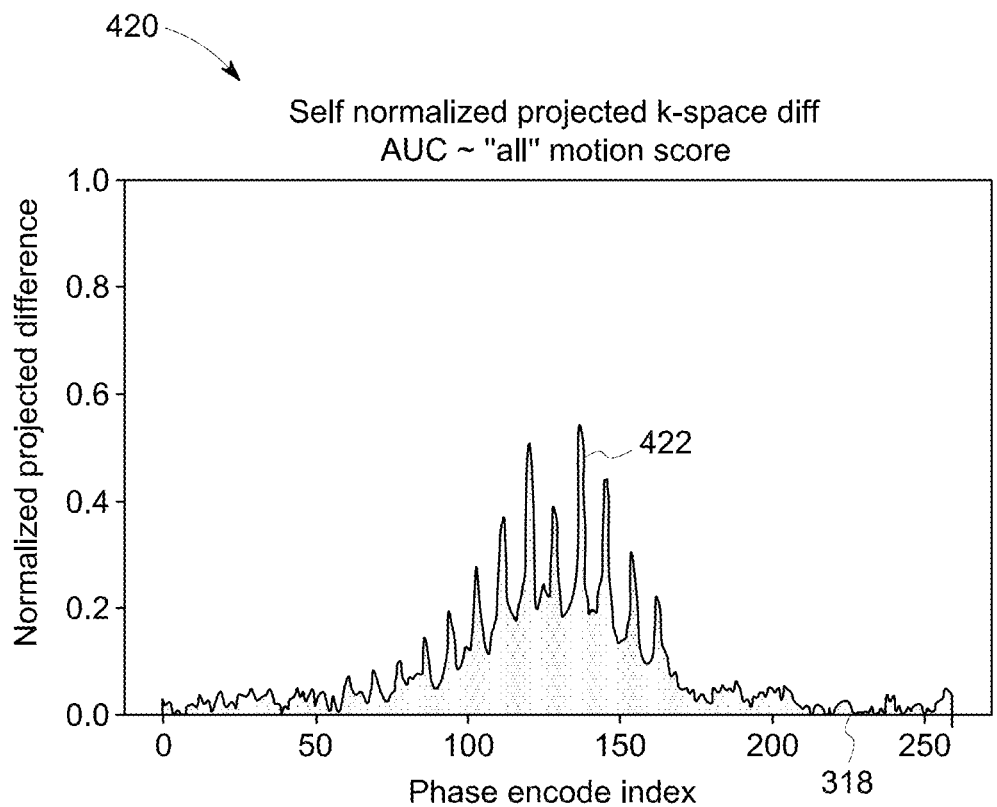
FIG. 4G is a normalized difference plot of the difference plot shown in FIG. 4F.
Figure 4H:
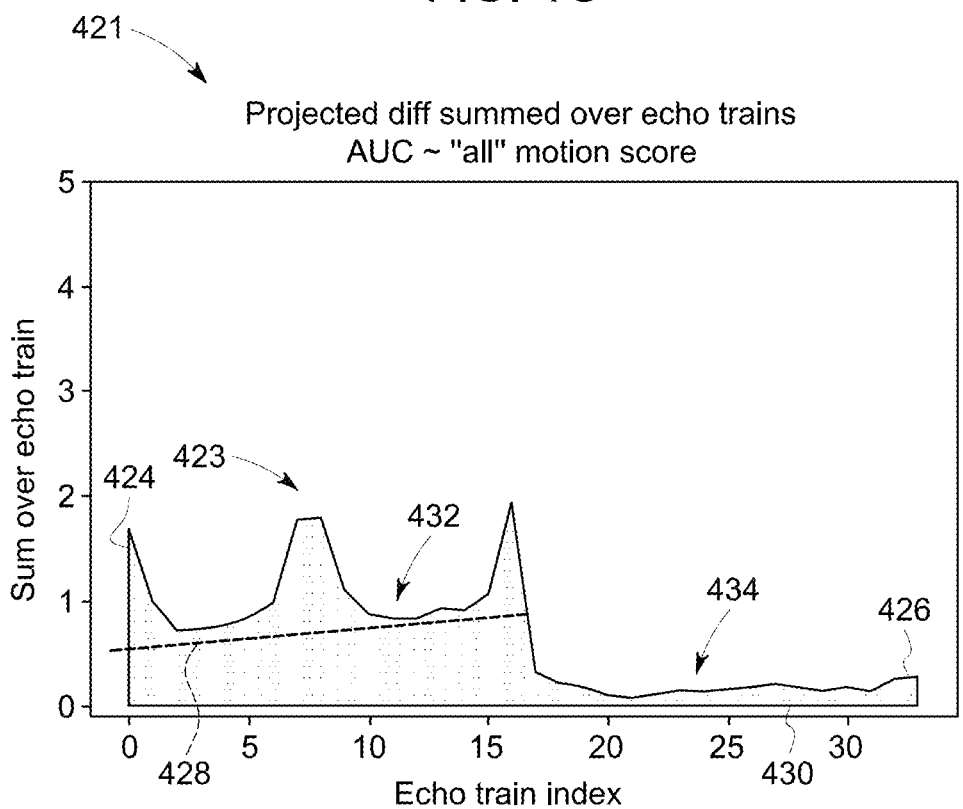
FIG. 4H is a summed difference plot based on the difference plot shown in FIG. 4G.

In the exemplary embodiment, the k-space difference map 414 is projected along the kx direction or the read-out direction, deriving a projected k-space difference plot 416 (FIG. 4E). The projected k-space difference plot 416 depicts the k-space difference as a function of the phase-encoding index 318, such as 318-1 to 318-8, 318'-1 to 318'-8, and 318"-1 to 318"-8 shown in FIG. 3B. The projected k-space difference plot 416 shown in FIG. 4E is for one slice. In FIG. 4F, the projected k-space difference plot 416 is averaged over slices to derive an averaged difference plot 418, by averaging projected k-space difference plots 416 of all slices along the slice direction. Averaging across slices increases signal to noise ratio (SNR), and improves the robustness and accuracy of motion detection and scoring. The averaged difference plot 418 is normalized by subtracting a baseline value at each phase encoding index 318 and dividing the difference by the baseline value, to derive a normalized difference plot 420 (FIG. 4G). If the difference between the averaged difference plot 418 at a phase encoding index 318 and the baseline value is zero, the division by the baseline value is not carried out at that phase encoding index. The baseline value may be derived by linear regression modelling of the averaged difference plot 418. To increase SNR in the difference plot 420, the normalized difference plot 420 may be summed over each echo train 322, deriving a summed difference plot 421 (FIG. 4H). For example, the values 422 in the normalized difference plot 420 corresponding to phase-encoding indexes 318-1 to 318-8 in an echo train 322-1 are summed together, and the summation operation is repeated for the rest of echo trains 322 such as 322-2 and 322-*n*. The area under a curve 423 in the summed difference plot 421 is an all-motion score. The area under a curve is an integral of the curve from a starting point to an end point. For example, the area under the curve 423 is the integral of the curve 423 from a point 424 to a point 426. An integral of a curve may be computed with any method known to a person of skill in the art, for example, by numerical integration. An all-motion score indicates the level of motion of the object during imaging with the pulse sequence 302. The motion indicated by an all-motion score includes discrete motion and continuous motion. Discrete motion is motion that happens sporadically. Continuous motion is motion that happens continuously for a period of time, compared to discrete motion.

Figure 4I:
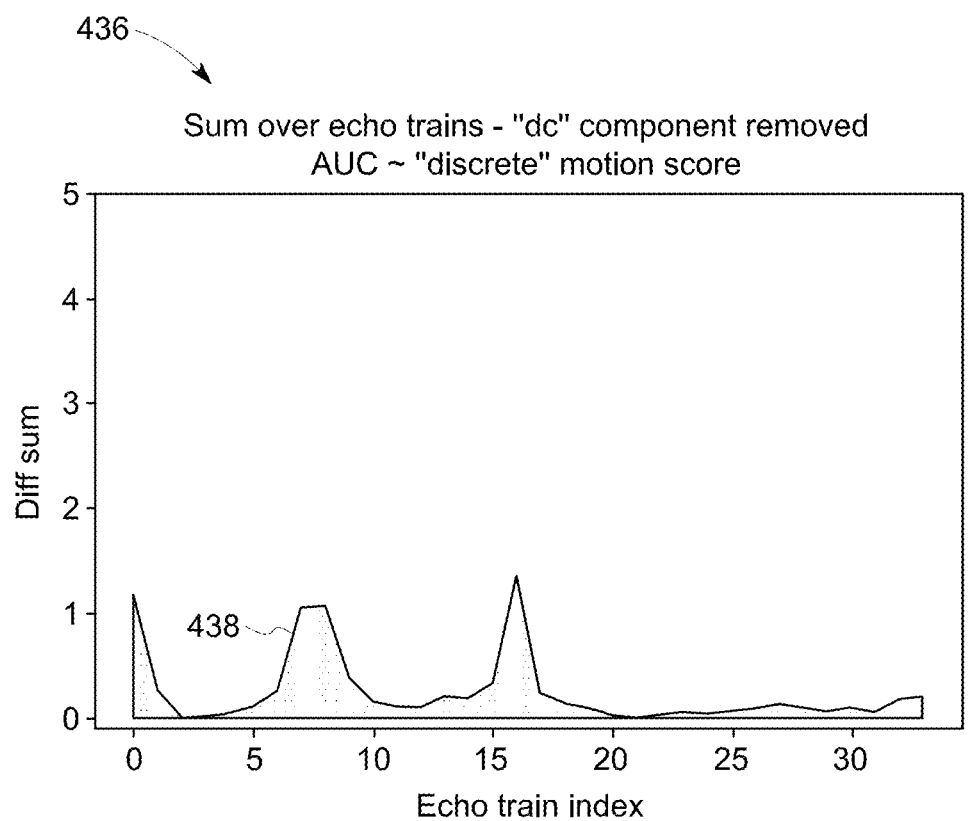
FIG. 4I is a difference plot derived from the difference plot shown in FIG. 4H.

In the exemplary embodiment, in the scan order 304 shown in FIG. 3B, ky lines 325 in a center region of the k space are acquired with early echo trains 322-*e*, while ky lines 327 in a peripheral region of the k space are acquired in the later echo trains 322-1. In FIG. 4H, the curve 423 may be divided into two portions, a first curve 432 and a second curve 434. The summed difference plot 421 for echo trains 322-*e* in the first curve 432 has a baseline value 428 higher than the baseline value 430 of the summed difference plot 421 for echo trains 322-1 in the second curve 434. For the echo trains 322-*e*, the baseline value 428 is subtracted from the summed difference plot 421. For the echo trains 322-1, the baseline value 430, smaller than the baseline value 428, is subtracted from the summed difference plot 421. As a result, a modified difference plot 436 is derived (FIG. 4I). The area under the curve 438 of the modified difference plot 436 is a discrete-motion score.

During the data formation and acquisition process, for each line with a given ky value and for each coil, the object's instantaneous MRI image is multiplied by the coil's sensitivity function and transformed into k-space, and the current ky line is read out. This multiplication by the coil sensitivity map causes the readout ky line for each coil to contain information from neighboring ky lines in a way that is different between the different coils. If a motion occurs, there is a new object pose and therefore the readout ky for each coil mixes the new and old k-spaces in a coil-specific manner. At the boundary of the motions, each coil contains a different mix of the two-underlying k-spaces. When there is no motion, the differences remain consistent. When there is continuous motion, a continuous response is present in the differences between the coils. Therefore the discrete peaks are related to the discrete motions and the offset is related to continuous motion.

Comparing with the all-motion score, which captures continuous motions and discrete motions, the discrete-motion score captures discrete motions. The discrete-motion score provides better separation of images with small motion artifacts from images without motion artifacts than the continuous motions or the combination of the discrete and continuous motions, but does not capture the significance of continuous motions.

A fast spin echo sequence is used as an example only. The systems and methods disclosed herein may be applied to MR signals and images acquired with other pulse sequences.

The all-motion score and the discrete-motion score disclosed herein provide objective measurement of the motion artifacts because the computation does not rely on inputs from, or determination by, a user. The all-motion scores and the discrete-motion scores may be referred to as calculated motion scores.

In some embodiments, a combined motion score may be generated. A development data set is rated to derive combined motion scores based on calculated motion scores and user-rated motion scores rated by a plurality of observers. Linear regression models are applied to fit the calculated motion scores with the user-rated motion scores. A combined motion score is computed as linearly transformed calculated motion scores with parameters derived from the linear regression modelling, such as the baseline value and/or the slope in the derived linear regression model. In one embodiment, different linear regression modelling between the calculated motion scores and the user-rated motion scores is used, depending on whether the calculated all-motion score is above or below a predetermined value. When the calculated all-motion score is greater than, or equal to, the predetermined value, the combined score is derived by linearly fitting the calculated all-motion scores to the user-rated motion scores. When the calculated all-motion score is equal to, or less than, the predetermined value, the combined score is derived as the linearly fitted value of the calculated discrete-motion score to the user-rated motion score. This approach may be taken to distinguish fine motions, because the discrete-motion score provides a better indication of fine motions, than the all-motion score.

Figure 5A:
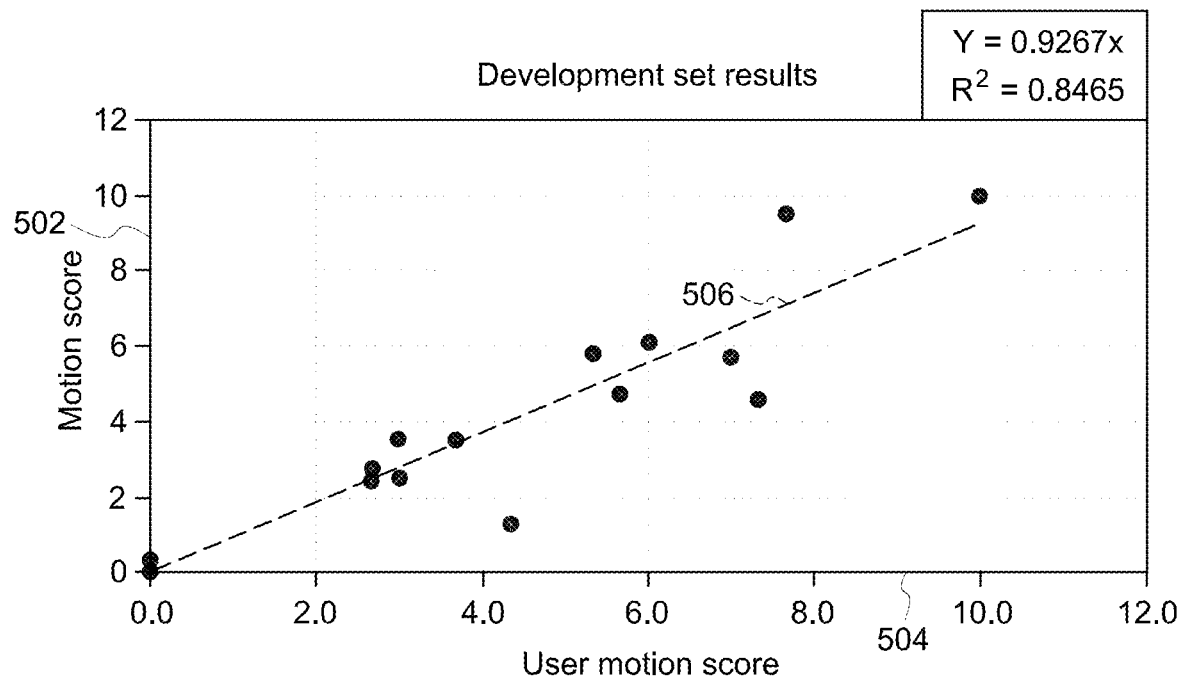
FIG. 5A is a plot showing calculated motion scores and user-rated motion scores of images in a development data set.
Figure 5B:
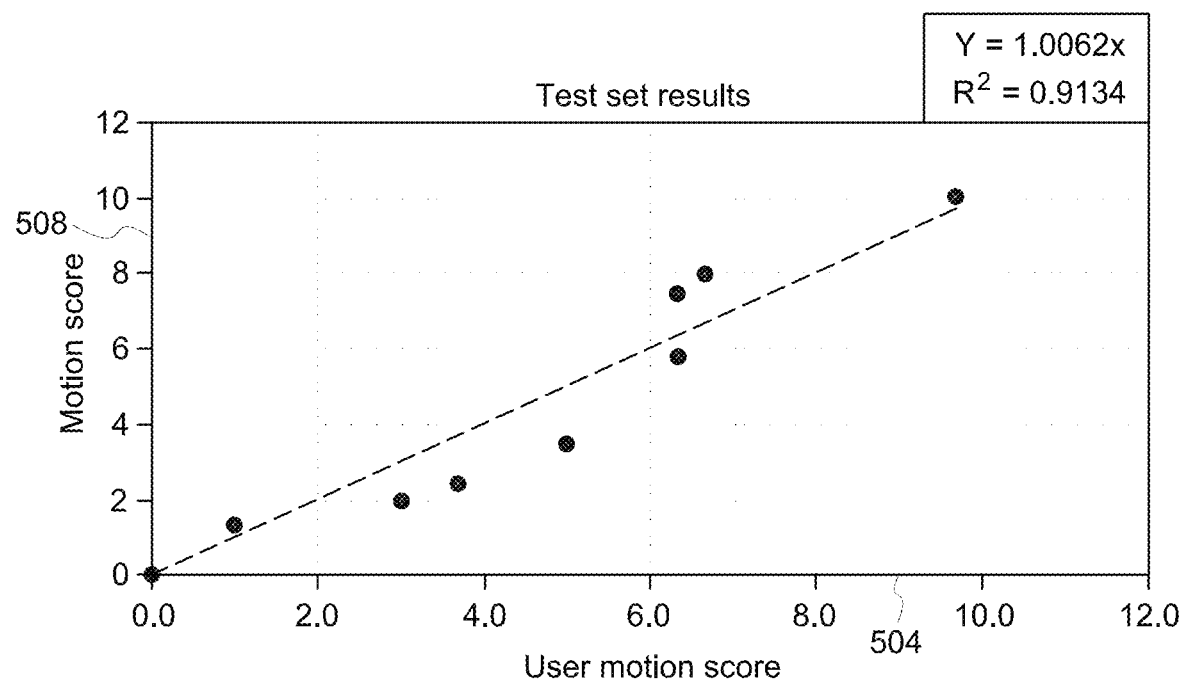
FIG. 5B is a plot showing calculated motion scores and user-rated motion scores of images in a test data set.
Figure 5C:
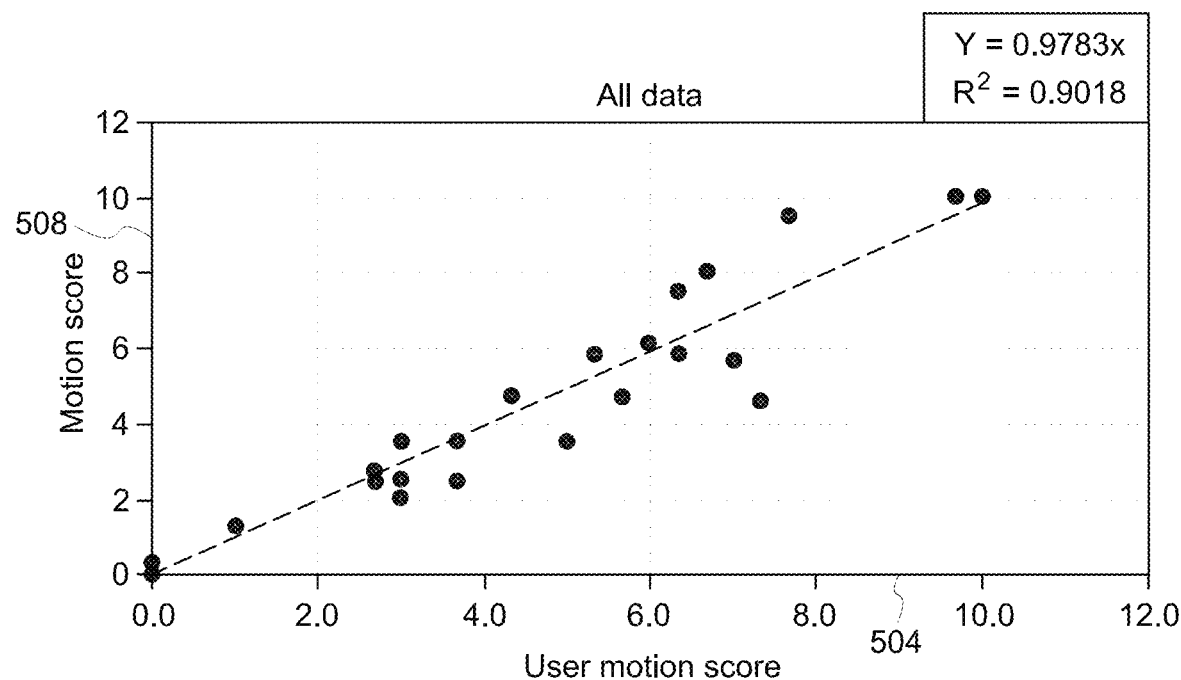
FIG. 5C is a plot showing calculated motion scores and user-rated motion scores of images in the development data set for the plot shown in FIG. 5A combined with the test data set for the plot shown in FIG. 5B.

FIGS. 5A-5C show validation results. FIG. 5A shows results using a development data set. The development data set is used to derive the linear relationship between the calculated motions scores 502 and user-rated motion scores. Calculated motion scores 502 of the images in the development data set are derived using the difference plots described in FIGS. 4A-4I. The development data set is also rated by a plurality of human observers to derive user-rated motion scores 504. The calculated motion scores 502 and the user-rated motion scores 504 are plotted against one another and linearly fitted to derive a linear relationship 506 between the calculated motion scores 502 and the user-rated motion scores 504. The inverse of the linear relationship 506 is used to transform calculated motion scores into combined motion scores 508. This approach is tested with a test data set. As shown in FIG. 5B, the combined motion score 508 matches the user-rated motion scores 504, with an exemplary indicator of goodness of fit $R^2$ as 0.9134, where an $R^2$ closer to 1 indicates a better fit of the linear regression model. Combined motion scores 508 are validated with the development data set and the test data set and the results are shown in FIG. 5C. The combined motion scores 508 are computed by transforming the calculated motions scores with the inverse of the relationship 506 derived with the development data set. In one embodiment, when the calculated all-motion score 502 is below a predetermined threshold level, the combined motion scores 508 are computed as the calculated discrete-motion scores transformed with the inverse of the relationship 506. When the calculated all-motion score 502 is above the predetermined threshold level, the combined motion scores 508 are computed as the calculated all-motion score 502 transformed with the inverse of the relationship 506. When the calculated all-motion score 502 is equal to the predetermined threshold level, the combined motion score 508 may be based on the calculated all-motion score 502 or the calculated discrete-motion score. As a result, fine motions indicated with relatively small calculated all-motion scores 502 are further distinguished using calculated discrete-motion scores.

Figure 6A:
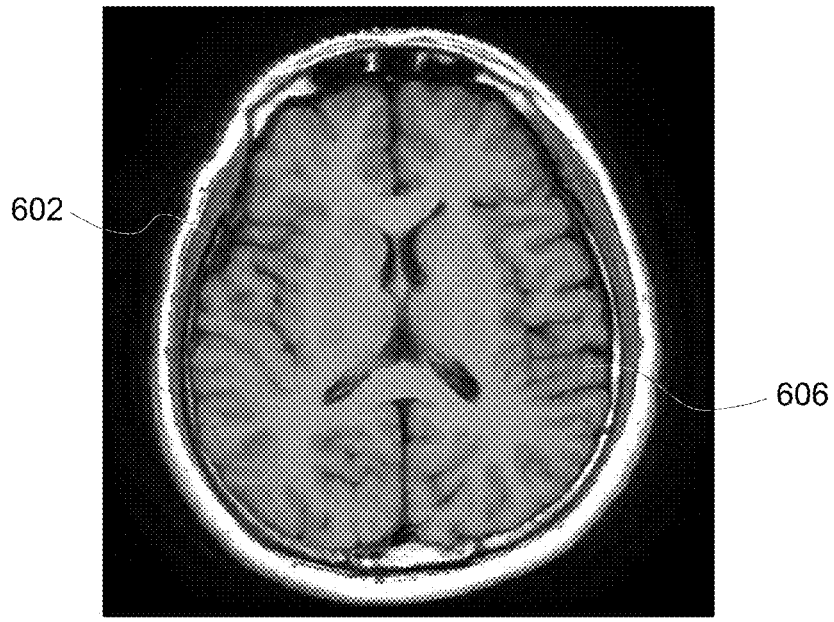
FIG. 6A is an MR image having a discrete-motion score of 1.3.
Figure 6B:
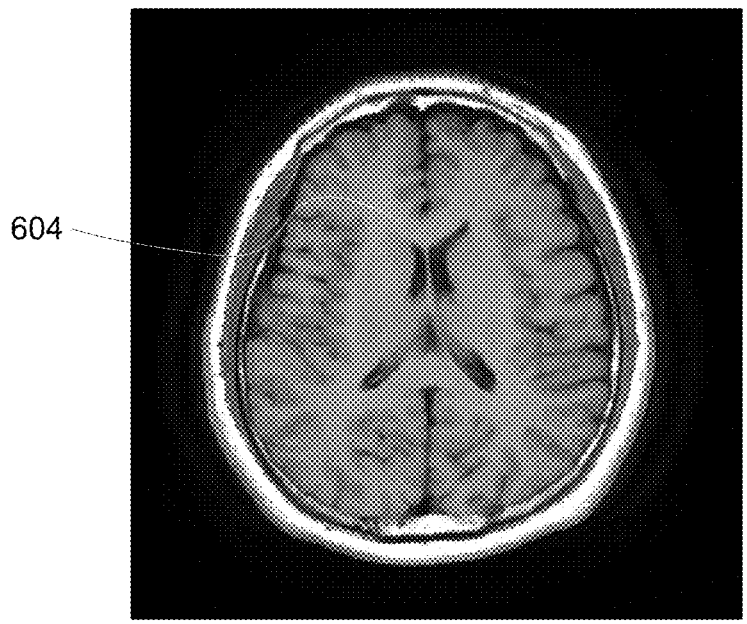
FIG. 6B is an MR image having a discrete-motion score of 0.

FIGS. 6A and 6B show discrete-motion scores indicate fine motions. FIG. 6A is a brain image 602 having a discrete-motion score of 1.3. FIG. 6B is a brain image 604 having a discrete-motion score of 0. The brain image 602 has fine motion artifacts 606, which are not readily discerned.

Figure 7A:
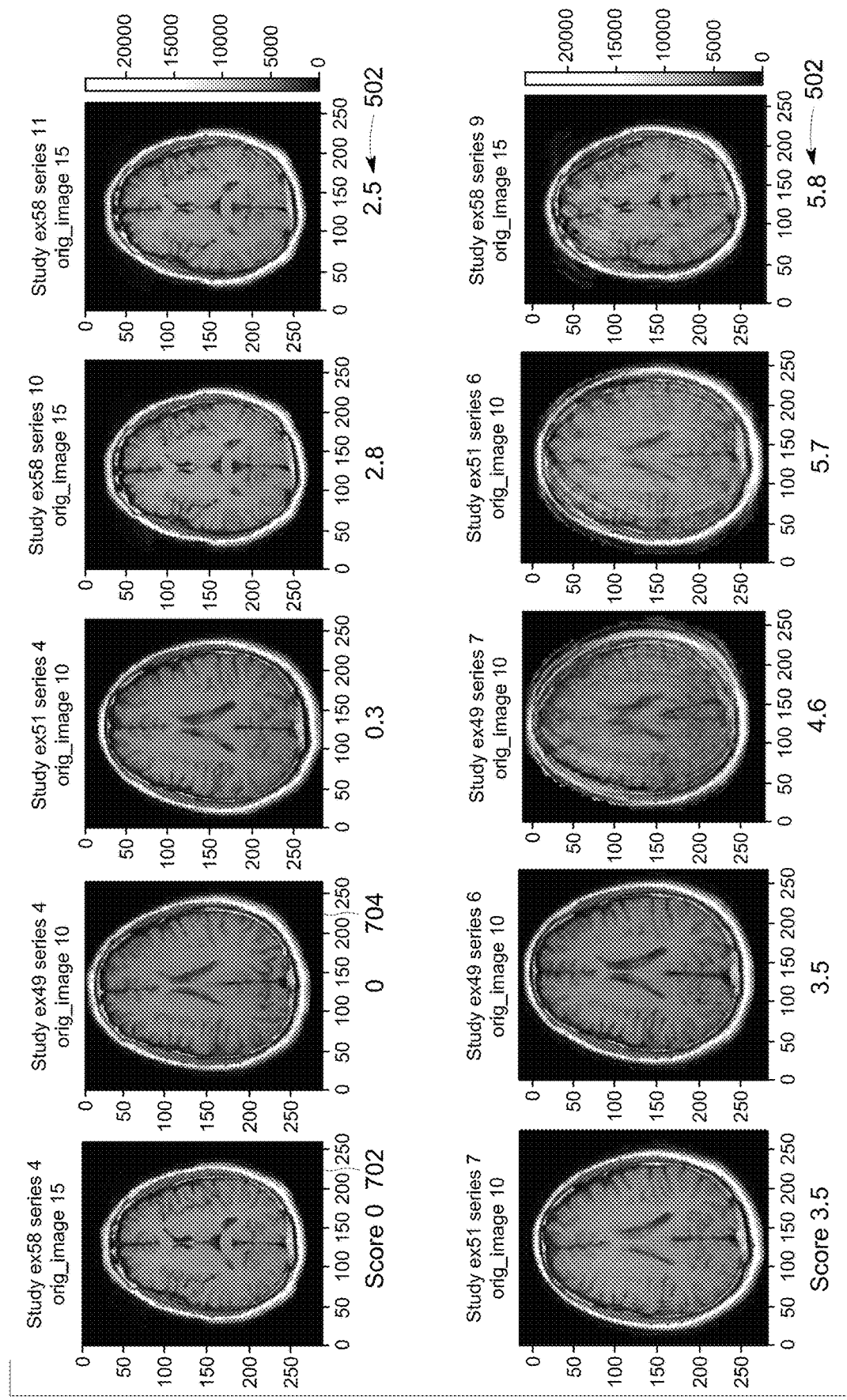
FIG. 7A are a set of MR images and their corresponding all-motion scores.
Figure 7B:
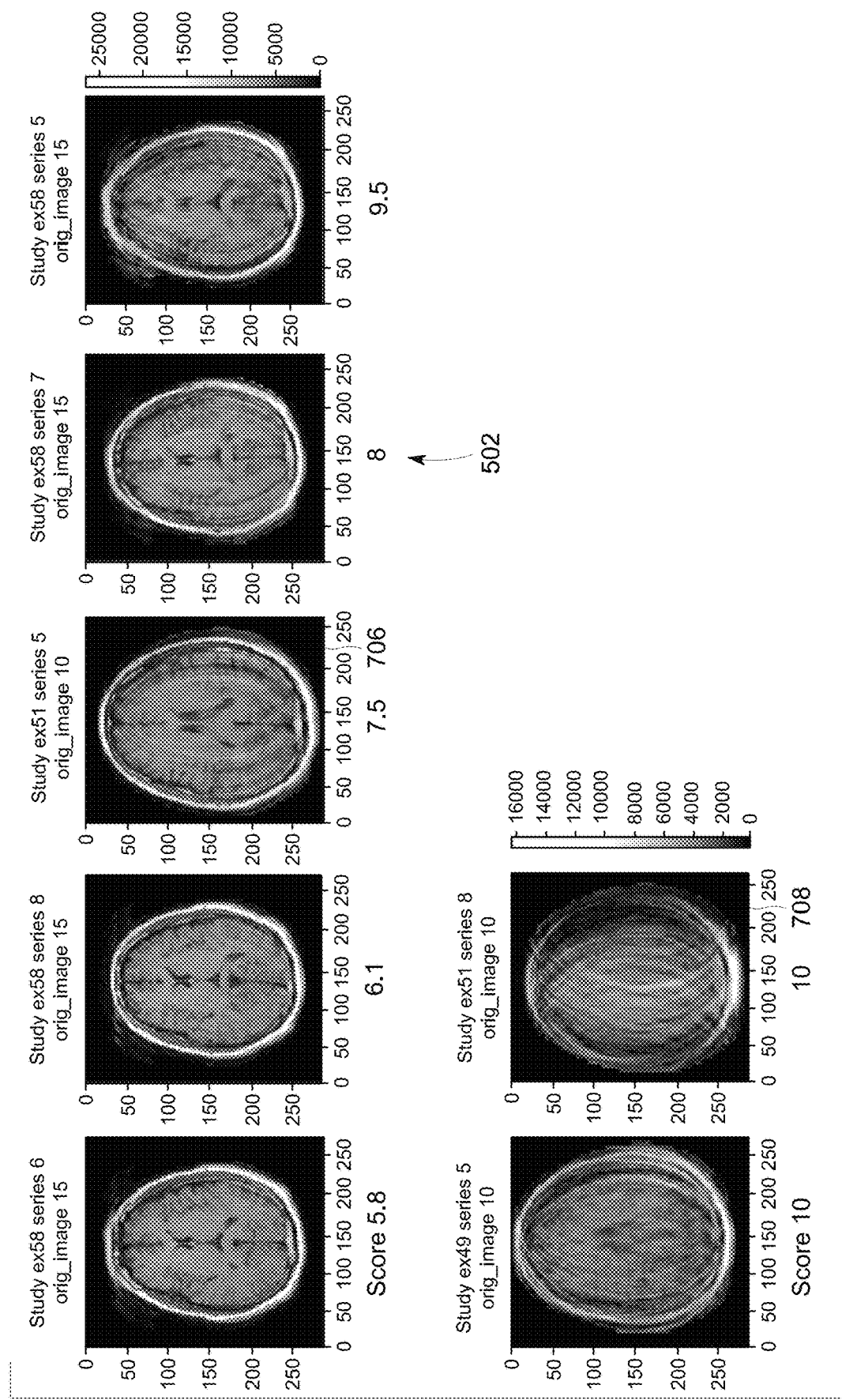
FIG. 7B are another set of MR images and their corresponding all-motion scores.

FIGS. 7A-7B show images and their calculated motion scores 502 using the systems and methods disclosed herein. The calculated motion scores 502 accurately reflect the level of motion artifacts presented in the images. For example, images 702, 704 have a calculated motion score of 0 and do not include discernible motion artifacts, while images 706, 708 have a calculated motion score of 7.5 or 10 respectively and include severe motion artifacts that render the images 706, 708 unusable.

In some embodiments, the calculated motion scores 502 are used to determine whether a motion correction of the image should be carried out. For example, if the calculated motion score 502 is above a predetermined level or in a specified range, motion correction may be performed on the acquired images. A motion-corrected image may be reconstructed by jointly estimating the motion-corrected image and motion parameters that best predict acquired k-space data. Correction may be performed by a neural network model or an iterative optimization approach. In the approach using a neural network model, the neural network model is trained with images having motion artifacts and images with motion artifacts corrected. The training data may be simulated training data set as images without motion artifacts and the images without motion artifacts added with simulated motion artifacts.

In the iterative optimization approach, motion correction is formulated as an optimization problem where a cost function, which represents data fitness, is minimized with respect to the motion-corrected image and motion parameters as optimization variables. The optimization problem may be solved by a numerical algorithm, which iteratively updates the motion-corrected image and motion parameters.

Suppose M discrete motions are detected, whose timings are $t_1, \ldots, t_M$. Then M+1 poses may be defined such that pose i corresponds to data acquisition between times $t_i$ and $t_{i+1}$ for $0 \leq i \leq M$ where $t_0$ and $t_{M+1}$ are the scan start time and the scan end time, respectively. Without loss of generality, pose 0 may be considered as a reference pose, which the motion-corrected image is to be reconstructed with respect to. The acquired multi-coil k-space data $y_i$ corresponding to pose i may be modeled as $$y_i = A_i F S T(\theta_i) x,$$

where x is the motion-free image corresponding to the reference pose, $T(\theta_i)$ is an operator that transforms the reference pose to pose i, parameterized by $\theta_i$, S applies coil sensitivities to an image, F is the Fourier transform operator, and $A_i$ is the sampling matrix containing the sampling pattern for data acquisition for pose i. Assuming rigid-body motion, each $\theta_i$ has 3 parameters for 2D (that is, 2 parameters for translation and 1 for rotation), and 6 parameters for 3D (that is, 3 parameters for translation and 3 parameters for rotation). The total number of unknown motion parameters is 3M for 2D, and 6M for 3D (except for the reference pose).

The motion-corrected image may be reconstructed by solving the following optimization problem:

$$(\hat{x}, \hat{\theta}) = \arg \min_{x, \theta} \sum_i \|y_i - A_i F S T(\theta_i) x\|^2,$$

where $\hat{x}$ is the reconstructed motion-corrected image, $\theta$ is the concatenation of $\theta_i$'s, and $\hat{\theta}$ represents the estimated motion parameters. An L2 norm may be used for the least square cost function. Alternatively, other types of cost functions, e.g., based on an L1 norm or weighted least squares, may be used. In some embodiments, the cost function may be regularized, e.g., by adding regularization functions for the motion-corrected image or the motion parameters. For example, a total variation penalty function, which is used in compressive sensing, may be used for the regularization function for the motion-corrected image.

To solve the optimization problem above, a numerical algorithm such as gradient descent, conjugate gradient, or Newton's algorithm may be used. The numerical algorithm iteratively updates the motion-corrected image and the motion parameters. The motion-corrected image and the motion parameters may be updated simultaneously, or alternately. To use the iterative numerical algorithm, initial estimates of the motion-corrected image and the motion parameters should be given. For example, a motion-corrupted image, which is obtained without any motion correction, and parameters corresponding to no motion may be used for the initial estimates. Alternatively, a grid search may be used for the initialization step. For example, for pre-determined values of the motion parameters, the goodness of fit is calculated, and the best parameters in terms of the goodness of fit are chosen and used for the initial estimate of the motion parameters. The grid-search approach is computationally expensive but may help avoid a local minimum.

Figure 8:
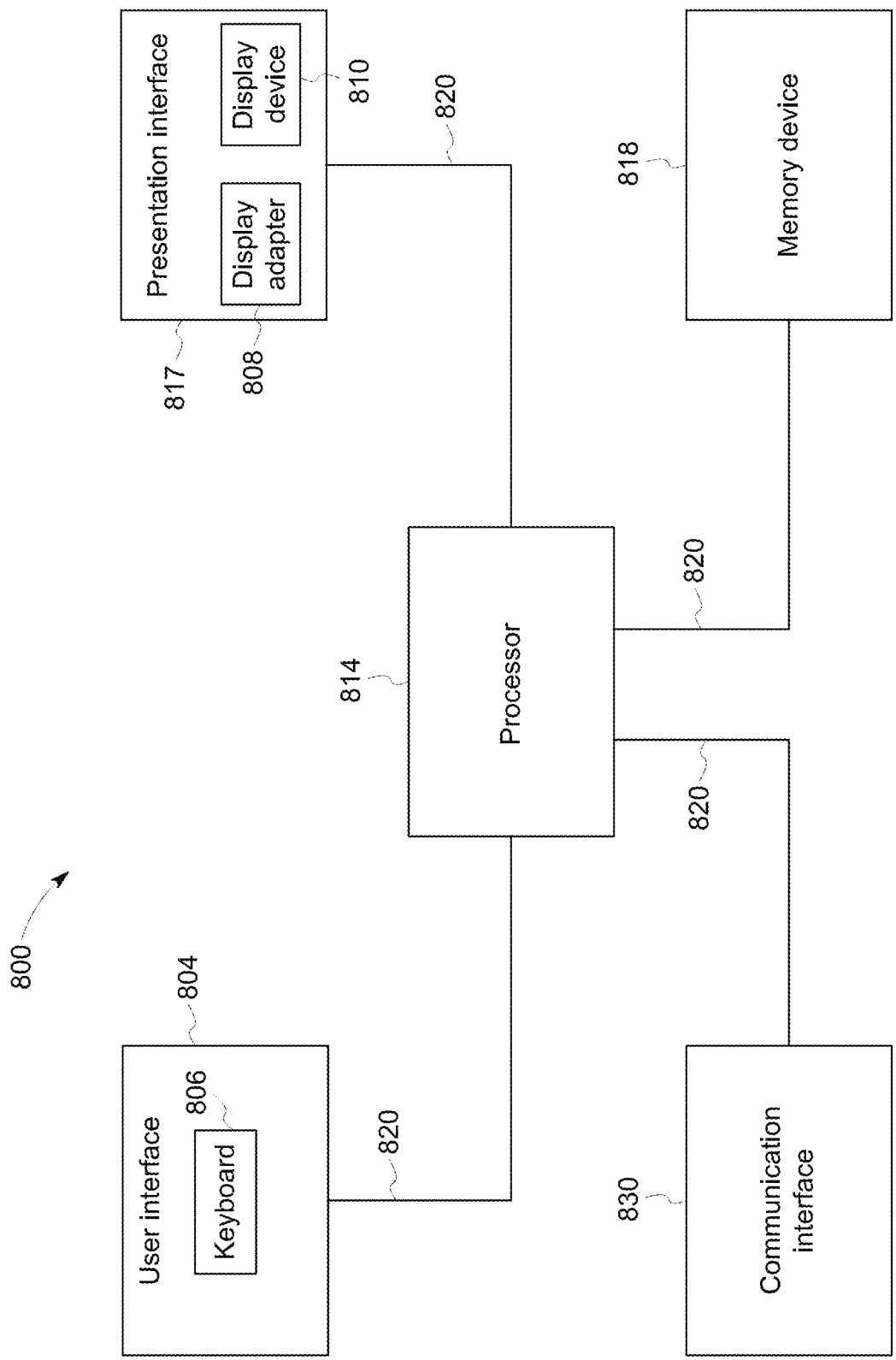
FIG. 8 is a block diagram of an exemplary computing device.

The workstation 12 and the motion detection and scoring computing device described herein may be any suitable computing device 800 and software implemented therein. FIG. 8 is a block diagram of an exemplary computing device 800. In the exemplary embodiment, the computing device 800 includes a user interface 804 that receives at least one input from a user. The user interface 804 may include a keyboard 806 that enables the user to input pertinent information. The user interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a display interface 817 that presents information, such as input events and/or validation results, to the user. The display interface 817 may also include a display adapter 808 that is coupled to at least one display device 810. More specifically, in the exemplary embodiment, the display device 810 may be a visual display device, such as a cathode ray tube (CRT), a liquid crystal display (LCD), a light-emitting diode (LED) display, and/or an "electronic ink" display. Alternatively, the display interface 817 may include an audio output device (e.g., an audio adapter and/or a speaker) and/or a printer.

The computing device 800 also includes a processor 814 and a memory device 818. The processor 814 is coupled to the user interface 804, the display interface 817, and the memory device 818 via a system bus 820. In the exemplary embodiment, the processor 814 communicates with the user, such as by prompting the user via the display interface 817 and/or by receiving user inputs via the user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, the memory device 818 includes one or more devices that enable information, such as executable instructions and/or other data, to be stored and retrieved. Moreover, the memory device 818 includes one or more computer readable media, such as, without limitation, dynamic random access memory (DRAM), static random access memory (SRAM), a solid state disk, and/or a hard disk. In the exemplary embodiment, the memory device 818 stores, without limitation, application source code, application object code, configuration data, additional input events, application states, assertion statements, validation results, and/or any other type of data. The computing device 800, in the exemplary embodiment, may also include a communication interface 830 that is coupled to the processor 814 via the system bus 820. Moreover, the communication interface 830 is communicatively coupled to data acquisition devices.

In the exemplary embodiment, the processor 814 may be programmed by encoding an operation using one or more executable instructions and providing the executable instructions in the memory device 818. In the exemplary embodiment, the processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

At least one technical effect of the systems and methods described herein includes (a) automatic scoring of motion artifacts; (b) a discrete-motion score indicating relatively fine motions; (c) a motion score providing an objective indication of motion artifacts; and (d) motion correction of images once motion artifacts are detected.

Exemplary embodiments of systems and methods of detecting and scoring motion artifacts are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A magnetic resonance (MR) imaging method of detecting and scoring motion artifacts in MR images of an object, comprising:
   computing a k-space difference map based at least in part on first MR signals of the object acquired with a first coil and second MR signals of the object simultaneously acquired with a second coil;
   generating a difference plot based on the k-space difference map, the difference plot including a curve; and
   calculating a motion score based on the curve in the difference plot, wherein the motion score indicates a level of motion artifacts in the image caused by motion of the object during acquisition of the first MR signals and the second MR signals, and the motion score includes an area under the curve; and
   outputting the motion score.

2. The method of claim 1, wherein the motion score is an all-motion score.

3. The method of claim 1, wherein generating a difference plot further comprises:
   dividing the curve in the difference plot into a first curve and a second curve, wherein the first curve corresponds to a center region of a k-space, and the second curve corresponds to a peripheral region of the k space.

4. The method of claim 3, further comprising:
   normalizing the first curve by a baseline value of the first curve;
   normalizing the second curve by a baseline value of the second curve; and
   calculating a motion score further comprising deriving the motion score by computing an area under the normalized first curve and an area under the normalized second curve, wherein the motion score includes a discrete-motion score.

5. The method of claim 1, wherein the first MR signals and the second MR signals are MR signals of a plurality of slices in the object, generating a difference plot further comprising averaging a plurality of difference plots over the plurality of slices to derive the difference plot, wherein each of the plurality of difference plots corresponds to one of the plurality of slices.

6. The method of claim 1, wherein the first MR signals and the second MR signals are MR signals of the object acquired with a plurality of echo trains, generating a difference plot further comprising summing the difference plot over each of the plurality of echo trains to derive the difference plot as a function of an index of the plurality of echo trains.

7. The method of claim 1, wherein generating a difference plot further comprises normalizing the difference plot by a baseline value of the curve.

8. The method of claim 1, wherein the motion score includes an all-motion score and a discrete-motion score, the all-motion score indicating a level of both discrete motion and continuous motion, and the discrete-motion score indicating a level of the discrete motion.

9. The method of claim 1, wherein calculating a motion score further comprises:
   generating a combined motion score based on the calculated motion score and a user-rated motion score.

10. The method of claim 1, wherein the motion score includes an all-motion score and a discrete-motion score, and calculating a motion score further comprises:
    generating a combined motion score based on the discrete-motion score if the all-motion score is less than a predetermined level.

11. The method of claim 1, wherein generating a difference plot further comprises projecting the k-space difference map along a first direction to derive the difference plot.

12. The method of claim 1, wherein the method further comprises generating an alert if the motion score is above a predetermined level.

13. The method of claim 1, wherein the method further comprises:
    performing a motion correction on an image of the object to derive a motion corrected image when the motion score is in a specified range.

14. A motion detection and scoring computing device, comprising at least one processor in communication with at least one memory device, and the at least one processor programmed to:
    compute a k-space difference map based at least in part on first MR signals of an object acquired with a first coil and second MR signals of the object simultaneously acquired with a second coil;
    generate a difference plot based on the k-space difference map, the difference plot including a curve; and
    calculate a motion score based on the curve in the difference plot, wherein the motion score indicates a level of motion artifacts in the image caused by motion of the object during acquisition of the first MR signals and the second MR signals, and the motion score includes an area under the curve; and
    output the motion score.

15. The computing device of claim 14, wherein the at least one processor is further programmed to:
    divide the curve in the difference plot into a first curve and a second curve, wherein the first curve corresponds to a center region of a k-space, and the second curve corresponds to a peripheral region of the k-space;
    normalize the first curve by a baseline value of the first curve;
    normalize the second curve by a baseline value of the second curve; and
    derive the motion score by computing an area under the normalized first curve and an area under the normalized second curve, wherein the motion score includes a discrete-motion score.

16. The computing device of claim 14, wherein the first MR signals and the second MR signals are MR signals of a plurality of slices in the object, the at least one processor is further programmed to average a plurality of difference plots over the plurality of slices to derive the difference plot, wherein each of the plurality of difference plots corresponds to one of the plurality of slices.

17. The computing device of claim 14, wherein the first MR signals and the second MR signals are MR signals of the object acquired with a plurality of echo trains, the at least one processor is further programmed to sum the difference plot over each of the plurality of echo trains to derive the difference plot as a function of an index of the plurality of echo trains.

18. The computing device of claim 14, wherein the motion score includes an all-motion score and a discrete-motion score, and the at least one processor is further programmed to:
    generate a combined motion score based on the discrete-motion score if the all-motion score is less than a predetermined level.

19. The computing device of claim 14, wherein the at least one processor is further programmed to generate an alert if the motion score is above a predetermined level.

20. The computing device of claim 14, wherein the at least one processor is further programmed to perform a motion correction on an image of the object to derive a motion corrected image when the motion score is in a specified range.

\* \* \* \* \*